(12) United States Patent
Prikhodko et al.

(10) Patent No.: US 7,944,306 B2
(45) Date of Patent: May 17, 2011

(54) DUAL BIAS CONTROL CIRCUIT

(75) Inventors: Dmitri Pavlovitch Prikhodko, Wijchen (NL); Remco Ooijman, Nijmegen (NL); Pieter Lok, Nijmegen (NL); Jeroen Sluijter, Nijmegen (NL)

(73) Assignee: NXP B.V., Eindhoven (NL)

(*) Notice: Subject to any disclaimer, the term of this patent is extended or adjusted under 35 U.S.C. 154(b) by 403 days.

(21) Appl. No.: 11/576,812

(22) PCT Filed: Oct. 5, 2005

(86) PCT No.: PCT/IB2005/053269
§ 371 (c)(1),
(2), (4) Date: Mar. 11, 2009

(87) PCT Pub. No.: WO2006/038189
PCT Pub. Date: Apr. 13, 2006

(65) Prior Publication Data
US 2009/0206933 A1    Aug. 20, 2009

(30) Foreign Application Priority Data
Oct. 8, 2004  (EP) .................... 04104940

(51) Int. Cl.
*H03F 1/02* (2006.01)
(52) U.S. Cl. ...................... 330/285; 330/133
(58) Field of Classification Search ............... 330/133, 330/285, 296–297, 310, 127
See application file for complete search history.

(56) References Cited

U.S. PATENT DOCUMENTS

| | | | |
|---|---|---|---|
| 4,663,599 A | 5/1987 | Patch | |
| 6,624,702 B1* | 9/2003 | Dening | 330/297 |
| 6,690,237 B2 | 2/2004 | Miyazawa | |
| 6,701,138 B2 | 3/2004 | Epperson | |
| 6,806,775 B2 | 10/2004 | Abe | |
| 6,917,243 B2* | 7/2005 | Doherty et al. | 330/133 |
| 2003/0155978 A1 | 8/2003 | Pehlke | |
| 2003/0184382 A1 | 10/2003 | Tsutsui et al. | |

FOREIGN PATENT DOCUMENTS

| | | |
|---|---|---|
| EP | 1 365 503 A2 | 11/2003 |
| JP | 62-11310 A | 1/1987 |
| JP | 5-37262 A | 2/1993 |
| JP | 2001-257540 A | 9/2001 |
| JP | 2004-236173 A | 8/2004 |
| WO | WO03105338 A | 12/2003 |
| WO | WO2004059832 A | 7/2004 |

OTHER PUBLICATIONS

Office Action in Japanese Patent Appln. 2007-535310 (Sep. 10, 2010).

* cited by examiner

*Primary Examiner* — Hieu P Nguyen

(57) ABSTRACT

The present invention relates to a bias control circuit and method for supplying a bias signal to at least one stage of an amplifier circuit, wherein a dual bias control is provided by generating a bias current and additionally using this bias current to derive a control signal for limiting a supply voltage of the at least one amplifier stage in response to the control signal. Thereby, a compression of the output signal of the amplifier stage, which results from the voltage limitation, can be realized in addition to the base current steering. This leads to a decrease in small signal gain and thus reduced output noise.

15 Claims, 4 Drawing Sheets

DUAL BIAS CONTROL CIRCUIT

This patent document claims the benefit, under 35 U.S.C. §371 of national stage entry of International Application No. PCT/IB2005/053269 filed on Oct. 5, 2005, which claims priority benefit under 35 U.S.C. §119 of European Patent Application No. 04104940.4 filed on Oct. 8, 2004, to which priority is also claimed here.

The present invention relates to a bias control circuit and method for supplying bias signals to at least one stage of the amplifier circuit. In particular, the present invention relates to a bias control circuitry for a high frequency power amplifier comprising a series of coupled amplifier stages.

Highly efficient linear power amplifiers are key components for mobile communication devices in which spectrally efficient modulation circuitrys are employed. There has been a variety of amplifier circuits proposed for efficient radio frequency (RF) signal amplification. However, the performance of these high-efficiency amplifiers is often non-linear, resulting in considerable out-of-band radiation and interference in adjacent channels. In order to satisfy the linearity requirement for preserving modulation accuracy with minimum spectral re-growth, power amplifiers are typically operated in high linear Class-A or Class-AB configurations, where the working point and operating range of the amplifier is located on a fairly linear region of the amplifier characteristic.

The demand for low-noise power amplifiers for GSM (Global System for Mobile communication) systems, operating in a highly non-linear region, has increased in recent years. The transmit (TX) band of a GSM power amplifier ranges from 880 to 915 MHz, while the receiver (RX) band ranges from 925 to 960 MHz. The input noise arriving at a GSM transceiver is wide-band. This noise, when mixed with the noise of the power amplifier itself, can interfere with the receiver channels. Thus, it is important to reduce the noise generated by the power amplifier and the small-signal gain (SSG) which amplifies the noise at the input. The SSG is defined in presence of the large transmit signal in the TX band as $SSG(fm) = Pout\_dBm(fm) - Pin\_dBm(fm)$, where fm is a frequency in the RX band, Pin_dBm designates the small-signal power (~−40 dBm) and Pout_dBm designates the output power at the frequency fm.

At present, most GSM power amplifiers are voltage control power amplifiers (VCPAs), operating with a constant input power and controlling the output power based on a control voltage. Usually, the level of the input power is quite high, e.g. Pin=−3 . . . +3 dBm, and power transistors are biased anywhere from zero volts to a voltage level at which the power amplifier delivers 35 dBm. In such a way, power transistors are passing through different classes of operation defined by the location of their working point or bias point, mainly class C and class AB. However, these more non-linear classes of operation lead to a considerable SSG at certain bias control voltages, and thus lead to high output noise.

FIG. 1 shows a schematic diagram indicating SSG versus control voltage Vc at different frequencies ss1, ss2, ss3 and large-signal gain (LSG) at a carrier frequency fc=915 MHz.

As can be gathered from FIG. 1, at a control voltage Vc=1.5 V, the SSG shows a maximum value at a much higher level than the LSG, which leads to undesirable signal-to-noise ratios at the output of the power amplifier due to the fact that amplification of small-signal noise components is higher than amplification of the desired large signal.

One possible solution which has been suggested is to damp the peaking of the SSG by connecting a parallel switching element, e.g. a CMOS (Complementary Metal Oxide Semiconductor) switch, between the collector or output terminal of the first stage of the power amplifier and ground potential to shunt the stage and thus damp the high SSG in the non-linear region. As soon as the bias point of the first stage has reached the linear region, the switching element is opened to allow the power amplifier to reach enough output power. If the same biasing circuitry is used for the first power amplifier stage and the switching element, a good timing of the operation can be achieved. The biasing of the following amplifier stages can be done in a conventional way. However, despite of the above damping solution, the peaking behavior of the SSG is usually still present.

Document U.S. Pat. No. 6,701,138 discloses a power amplifier circuitry, where the input stage is powered separately from the output stage by a relatively fixed power source. The one or more output stages are supplied with power via a voltage controller having a controllable output voltage. A closed loop control function integrated with the amplifier stages forces the voltage output of the voltage controller to track the profile of an adjustable control signal. However, this control circuitry leads to losses at low output power levels. These losses are the result of the supply voltage drop at the $2^{nd}$ and $3^{rd}$ stages of the power amplifier. Moreover, a large voltage controller or regulator is required to handle the large current, which may be in the order of several amperes. Another drawback is that the bias network and voltage controller are not correlated causing a potential problem of instability.

It is therefore an object of the present invention to provide an improved bias control circuit for amplifier circuits, by means of which a small SSG and low noise can be ensured for the whole operating range at low efficiency losses and sufficient stability.

This object is achieved by a bias control circuit as claimed in claim 1 and by a bias control method as claimed in claim 8.

Accordingly, the supply voltage of the at least one amplifier stage is limited in response to a control signal derived from the biasing current. Thereby, a dual biasing circuitry is provided where the at least one amplifier stage is biased using both current and voltage control, which results in lowered SSG and reduced noise. In such a way an output power slope can be realized due to the base current steering and at the same time the output of the amplifier stage can be compressed as a result of the voltage limitation. The voltage and current steering originated from the same source leads to a stable circuitry.

The current generating means may comprise a voltage-to-current converter having a predetermined current control characteristic. The voltage-to-current inverter is advantageous in realizing the necessary shape of the current control curve to achieve a direct high impedance current steering at the control input of the at least one amplifier stage. In particular, the current generating means may comprise current mirror means for copying an output current of the voltage-to-current converter to generate the bias current and a second current, wherein the second current is supplied to a voltage buffer means for generating the control voltage. The use of the current mirror means ensures that two closely related copies of the output current of the voltage-to-current converter are generated, which can be used for the dual bias control. As an example, the voltage buffer means may comprise an operational amplifier connected to a resistor means through which the second current is caused to flow. This measure serves to obtain a control voltage which is closely related to the copied output current of the voltage-o-current converter, so that the operation of the voltage limiting means is controlled in response to the copied output current of the voltage-to-current converter.

The voltage limitation means may comprise variable resistor means connected between supply voltage terminal and the at least one stage. As an example, the variable resistor means may comprise a transistor which is arranged to receive the control signal at a control terminal thereof. This measure provides the advantage that the voltage limitation means is simply achieved by providing controllable resistors in series with the supply voltage of the amplifier stage so as to control the supply voltage in dependence on the copied output current of the voltage-to-current converter.

The bias control circuit may comprise at least two of the current generating means and voltage limitation means allocated to respective stages of the amplifier circuit. In this case, the dual bias control circuitry is also applied to the at least one following amplifier stage in a similar way as to the first amplifier stage. This serves to further reduce SSG in relation to LSG so as to obtain a further improvement in noise reduction.

The present invention will now be described based on preferred embodiments with reference to the accompanying drawings, in which.

The preferred embodiment will now be described in connection with a multi-stage power amplifier such as a high-frequency power amplifier used in cellular phones or the like, which requires high efficiency and high linearity. It may contain transistors and passive components which may be integrated on a Microwave Monolithic IC (MMIC), where the transistors and passive components are arranged on the same semiconductor substrate.

Figure 1:
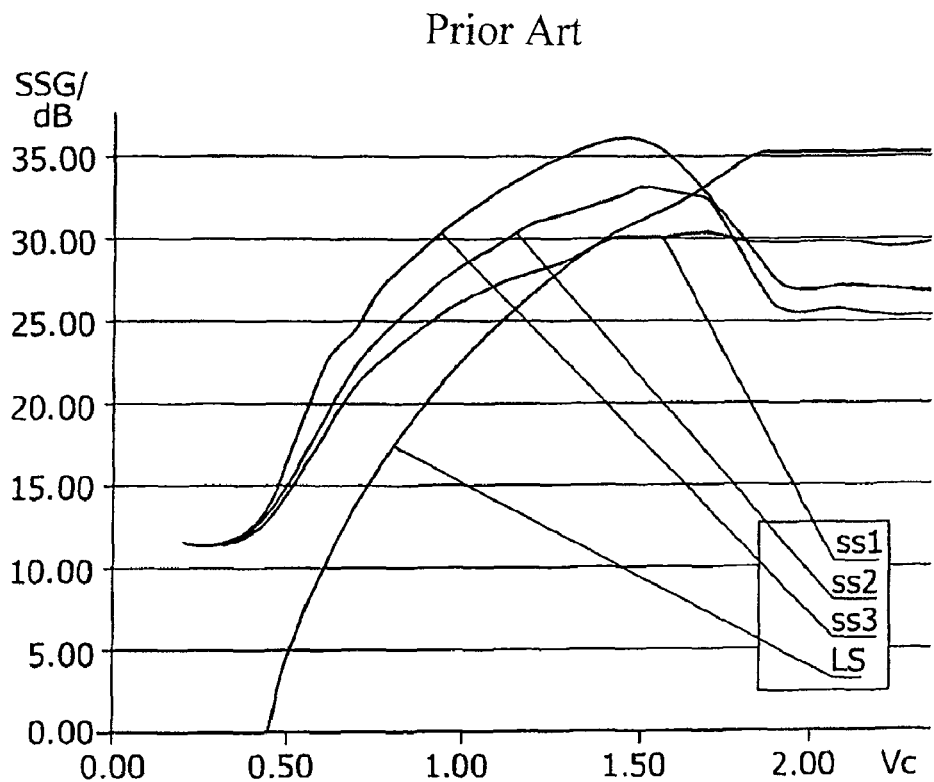
FIG. 1 shows a schematic diagram of a curve indicating SSG at different frequencies and LSG at a predetermined carrier frequency in a conventionally biased power amplifier circuit.
Figure 2:
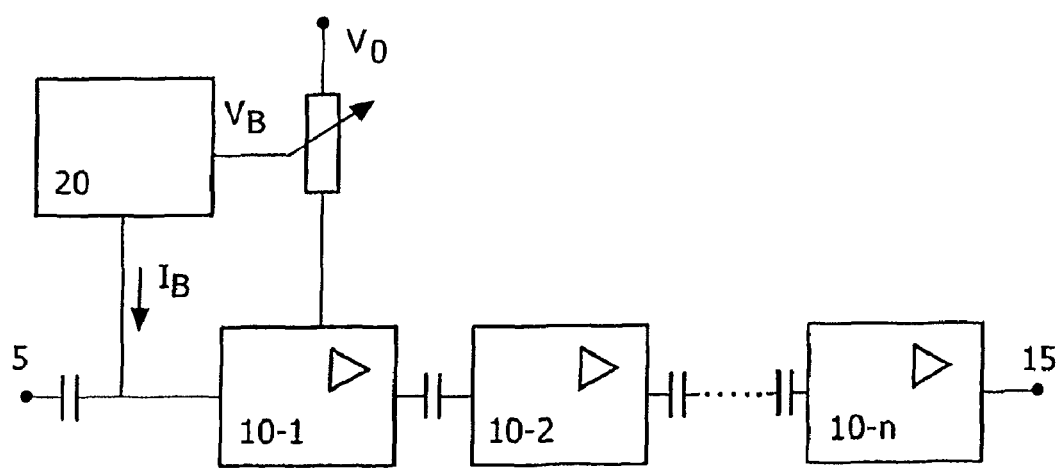
FIG. 2 shows a schematic block diagram of an amplifier circuit according to a first preferred embodiment of the present invention.

FIG. 2 shows a schematic block diagram of the multi-stage power amplifier circuit with a dual-bias circuit 20, according to the first preferred embodiment. This dual bias circuit 20 may optionally also be integrated into the MMIC of the respective allocated amplifier stage 10-1.

In particular, the power amplifier comprises an input terminal 5 for inputting an RF input signal via a coupling capacity to a first amplifier stage 10-2 which is coupled via a corresponding coupling capacity to a second and following amplifier stages 10-2 to 10-$n$ coupled via respective coupling capacities to successively amplify the RF input signal and supply an amplified RF signal at an output terminal 15. In the amplifier stages 10-1 to 10-$n$ at least one heterojunction bipolar transistor (HBT) such as InGaP/GaAs type or the like can be used in order to simultaneously realize both, high efficiency and high linearity. However, the present invention is not limited to such a technology, and field effect transistors (FET) or high electron mobility transistors (HEMT) may be employed as transistors other than bipolar transistors.

The dual bias circuit 20 serves to generate a bias current $I_B$ supplied to a corresponding input terminal of the allocated amplifier stage (i.e. the first amplifier stage 10-1 in FIG. 2), and a control voltage $V_B$ supplied to a voltage limitation element or means connected between a supply voltage $V_0$ and the allocated amplifier stage. In FIG. 2, the voltage limitation element is shown as a variable resistor, the resistance of which is controlled by the control voltage $V_B$. However, the invention is not restricted to such a variable resistor, but any element or circuitry which serves to reduce the voltage at the corresponding input terminal of the allocated amplifier stage in accordance with the control voltage $V_B$ or any other control signal can be used. As an example, the voltage limitation means may be a controllable semiconductor element or semiconductor circuitry for introducing a voltage drop in dependence on or in accordance with the applied control voltage $V_B$ or another control signal.

The bias current $I_B$ is supplied in order to define a bias point of the at least one transistor of the first amplifier stage 10-1, so as to achieve a desired characteristic, e.g., sufficient linearity. According to the preferred embodiments, the dual bias circuit 20 supplies the bias current $I_B$ for controlling the bias point of the allocated power amplifier stage, and a control voltage $V_B$ for controlling a voltage limitation means, such as a controllable resistor, to thereby realize a compression of the output signal of the allocated amplifier stage resulting from the introduced voltage limitation. Thereby, efficiency losses can be reduced. In addition, the voltage and current steering of the allocated amplifier stage from one source, i.e. the dual bias circuit 20, serves to keep the whole amplifier circuitry quite stable. The biasing of the second and following stages 10-2 to 10-$n$ can be done in the conventional way, i.e., by a bias circuit with an output bias current as the only bias signal.

Figure 3:
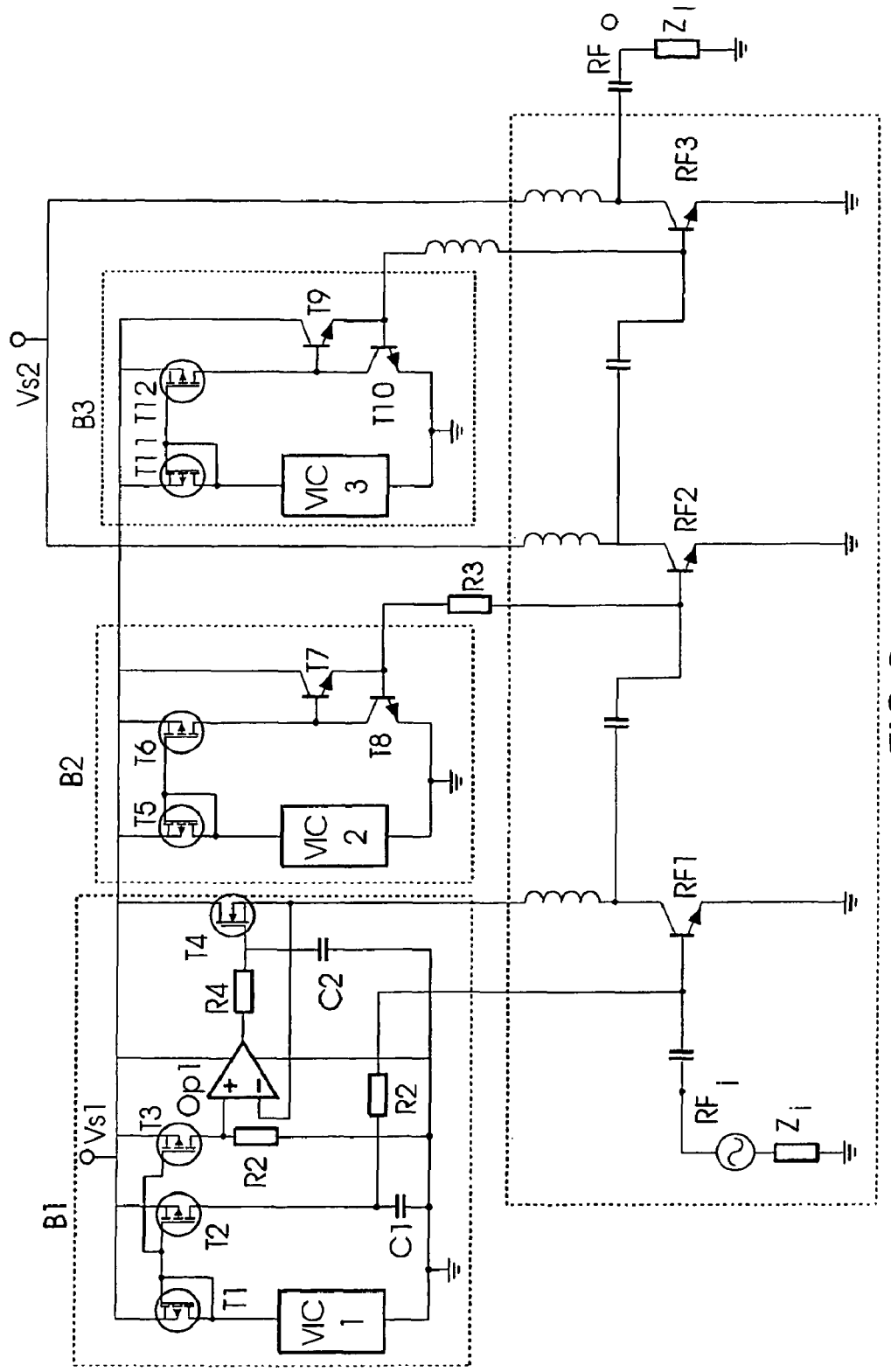
FIG. 3 shows a more detailed circuit diagram of the amplifier circuit according to the first preferred embodiment.

FIG. 3 shows a more detailed circuit diagram of the amplifier circuit according to the first preferred embodiment and arranged as a three-stage power amplifier, where the dual bias circuit 20 and the voltage limitation means is combined in a first bias unit B1 used for biasing a first bipolar transistor RF1 of the first amplifier stage to which an input signal $RF_i$ is supplied from a source with an input impedance $Z_i$. Furthermore, second and third transistor stages with respective transistors RF2 and RF3 are biased by respective bias units B2 and B3, which in contrast to the first bias unit B1 only supply a respective bias current and do not provide any voltage limitation. The output signal $RF_o$ of the amplifier circuit is supplied to a load impedance $Z_1$ which may be the input impedance of a following stage or the characteristic impedance of a waveguide or signal line.

Each of the bias units B1, B2 and B3 comprises a respective voltage-to-current converter VIC1 to VIC3 which provides a predetermined control characteristic with a desired predetermined shape of the current control curve defining the relation between an applied control voltage and an output current which is mirrored by a current mirror circuit so as to be supplied to the base terminal of the bipolar transistors RF1 to RF3. The voltage-to-current converters VIC1 to VIC3 may be implemented by any suitable electronic element or circuitry which converts an input voltage into a corresponding output current. As an example, an emitter-follower-transistor circuit may be used, which generates the output bias current in accordance with the control input voltage supplied from the outside. Then, the collector of the emitter-follower-transistor may be connected via respective first current mirror transistors T1, T5 and T9, respectively, to the supply voltage Vs1, while the emitter of the emitter-follower-transistor may be grounded. The base of the emitter-follower-transistor can be connected e.g. via a transistor to the control input terminal (not shown) to which the control voltage is supplied from the outside. Thereby, the current flowing through the branch of the voltage-to-current converters VIC1 to VIC3 corresponds to their respective control voltages. In the bias units B2 and B3 of the second and third stages of the three-stage amplifier circuit of FIG. 3, the bias current generated by the voltage-to-current converters VIC2 and VIC3, respectively, is copied by the first current mirror transistors T5 and T9, respectively, to a second current mirror transistor T6 and T10, respectively, which copies the output current of the voltage-to-current converters VIC2 and VIC3, respectively, to an output branch connected to the base terminal of the respective amplifier transistors RF2 and RF3, respectively.

In the second stage, the bias current $I_B$ is supplied via a resistor R3, while, in the third stage, the bias current is supplied via an RF choke coil to thereby improve RF/DC isolation. RF choke coils are inductivities which provide a low resistance path to a DC current but are chosen so that their inductive reactance is large enough for the RF signal to block the RF current. Similarly, the collectors of the power amplifier transistors RF2 and RF3 are connected via respective RF choke coils to a second supply voltage Vs2.

According to the first preferred embodiment, the first bias unit B1 is arranged as a dual bias unit and comprises an additional voltage limitation circuit consisting of the resistor R1, the operational amplifier Op1, the resistor R4, the capacitor C2 and the transistor T4 which functions as a controllable resistor connected via an RF choke coil for isolation purposes to the power amplifier transistor RF1 of the first amplifier stage. The first bias unit B1 thus functions to bias the first amplifier stage using both current and voltage control. The current generated by the voltage-to-current converter VIC1 is mirrored or copied by the current mirror circuit consisting of the MOS transistors T1 to T3 into two directions or branches. The first branch to which the current is copied by the current mirror transistor T2 directs the copied current as a bias current via a resistor R2 to the base of the bipolar power amplifier transistor RF1 and thus provides a direct high impedance current steering of the base of this transistor. The other branch to which the current is copied by the current mirror transistor T3 generates a corresponding control voltage across the resistor R1 which control voltage is input to the operational amplifier Op1. The operational amplifier Op1 functions as a voltage buffer and supplies its output voltage via a serial resistor R4 and the parallel capacitor C2 to the base of the MOS transistor T4 so as to control the resistance of the source-drain path of the transistor T4. Thereby, the resistance between the collector of the power amplifier transistor RF1 and the power supply voltage Vs1 and thus the supply voltage of the power amplifier transistor RF1 can be controlled and limited in response to a control signal derived from the voltage-to-current converter VIC1. In such a way, an output power slope can be realized due to the base current steering, and, at the same time, a compression of the power of the power amplifier transistor RF1 can be introduced, which results from the voltage limitation by the MOS transistor T4.

The current flowing through the power amplifier transistor RF1 of the first stage is usually in the order of 30 to 40 mA at maximum, so that problems with efficiency losses are minor. The combined voltage and current steering is derived from the same current source, i.e. voltage-to-current converter VIC1, and hence leads to a good stability of the power amplifier circuit. As already mentioned, the biasing of the second and third stage is done in a conventional way by a current control with a low impedance voltage source in the biasing circuitry formed by transistors T7 and T8 for the second stage and by transistors T9 and T10 for the third stage.

Figure 4:
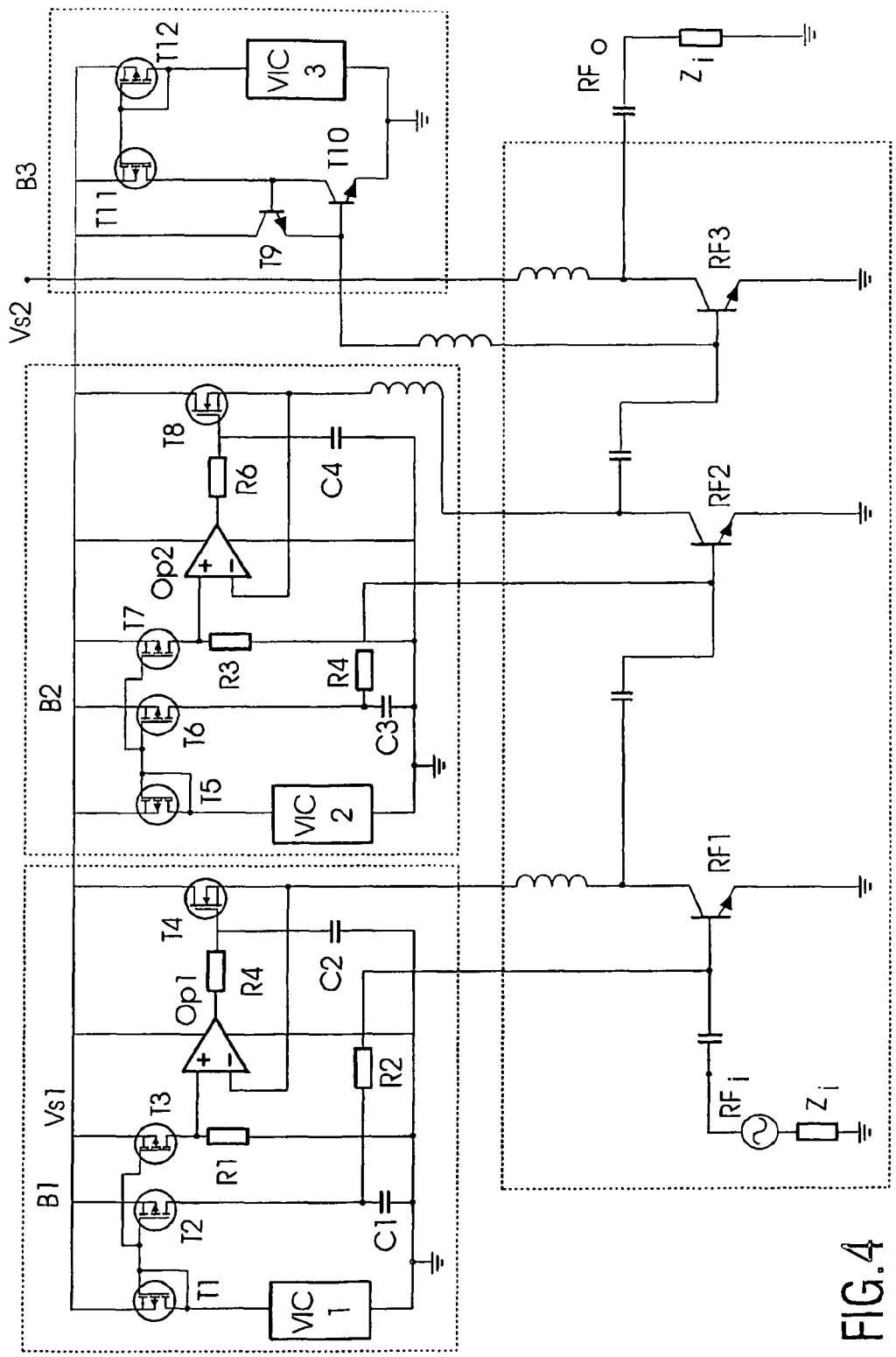
FIG. 4 shows a circuit diagram of an amplifier circuit according to a second preferred embodiment of the present invention.

FIG. 4 shows a second preferred embodiment where both first and second stages of the power amplifier are biased by respective dual bias units B1 and B2. As the second dual bias unit B2 is similar to the first one, it is referred to the above description of the first dual bias unit B1. The third stage can then still be biased by a conventional bias unit B3.

Figure 5:
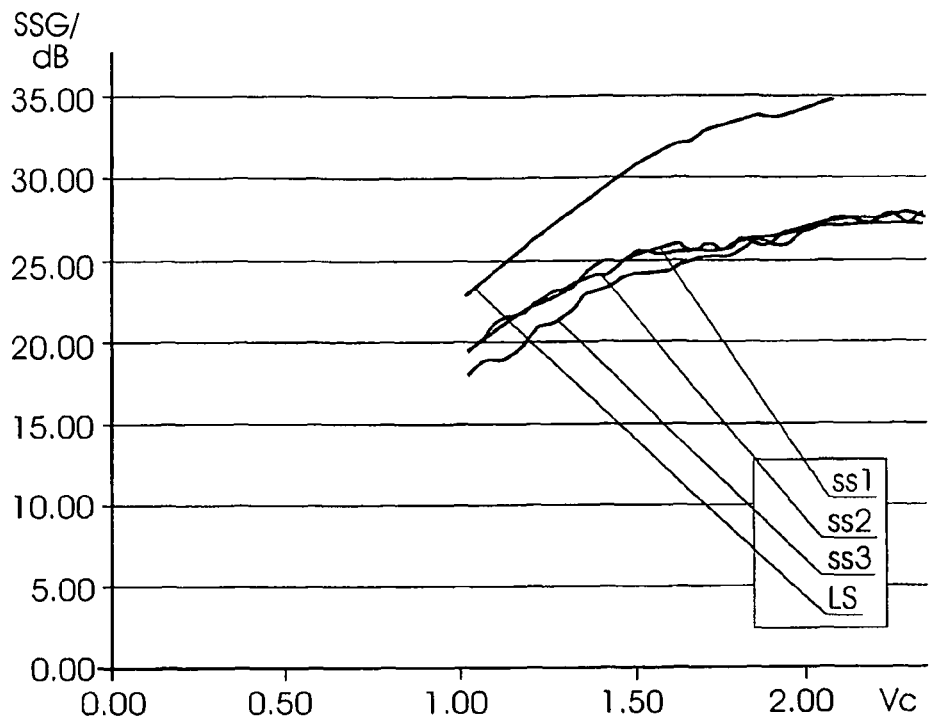
FIG. 5 shows a schematic diagram of a curve of the SSG at different frequencies and LSG at the predetermined carrier frequency, as obtained in the first preferred embodiment.

FIG. 5 shows a schematic diagram indicating measured SSG of the power amplifier circuit with the dual bias control in dependence on the control voltage Vc supplied to the voltage-to-current converter. As can be gathered from FIG. 5, the SSG at different frequencies ss1, ss2 and ss3 is reduced in comparison to the LSG of the large signal (LS) at a carrier frequency of e.g. fc=915 MHz. SSG thus can be always kept lower than LSG.

Figure 6:
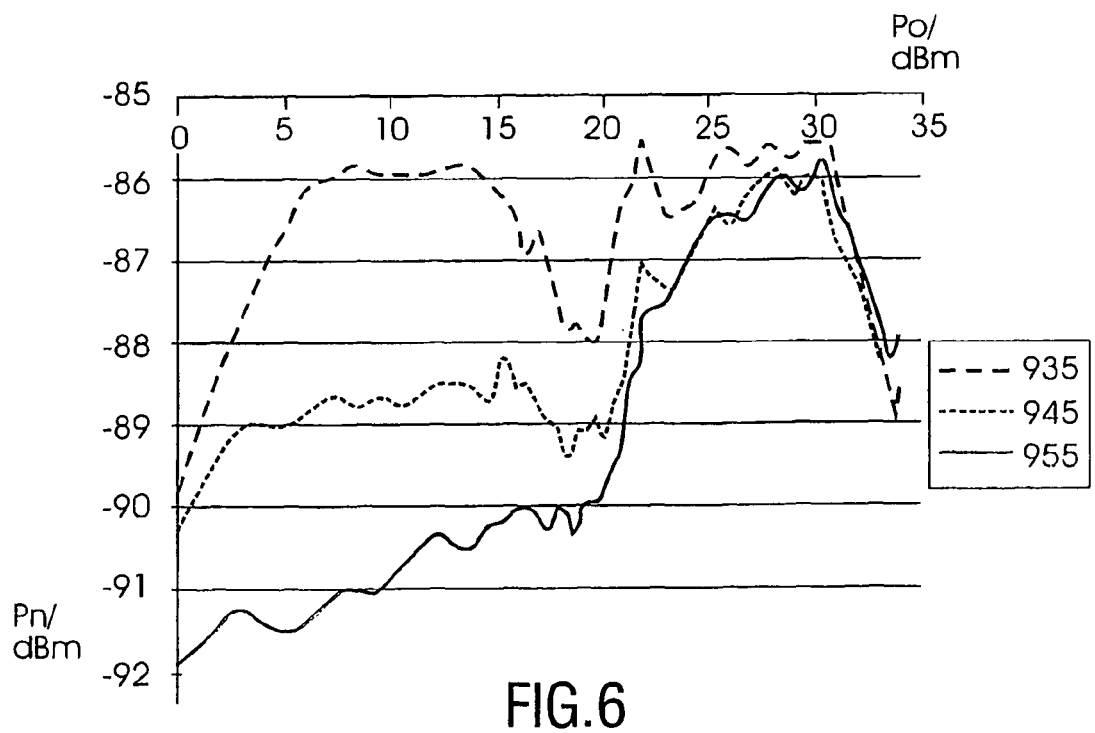
FIG. 6 shows a diagram indicating noise power versus output power at different frequencies for the predetermined carrier frequency.

FIG. 6 shows a diagram indicating measured noise power Pn versus output power Po in dBm for different frequencies 135 MHz, 945 MHz and 955 MHz at a carrier frequency of fc=915 MHz. According to FIG. 6, the noise power always remains below −85 dBm for all power levels of the output power Po. Thus, an improved noise reduction can be achieved by the proposed dual bias circuit.

It is to be noted that the present invention is not restricted to the above preferred embodiments but can be used in any amplifier circuit of any bipolar or unipolar technology where a bias control is used. The preferred embodiments may thus vary within the scope of the attached claims.

It must further be noted that the term 'comprising' when used in the specification including the claims is intended to specify the presence of stated features, means, steps or components, but does not exclude the presence or addition of one or more other features, means, steps or components or groups thereof. Furthermore, the word 'a' or 'an' preceding an element in a claim does not exclude the presence of a plurality of such elements. Moreover, any reference sign does not limit the scope of the claims.

The invention claimed is:

1. In a circuit arrangement having cascaded amplification stages, each of which feeds into the next, and each drawing operating power from a power terminal that provides a supply voltage, a circuit comprising:
    at least a first one of the cascade amplification stages configured and arranged to provide an rf output signal to the next amplification stage,
    a control circuit configured to generate
        a bias control signal that provides a bias current used to set a bias point at which to operate the first one of the amplification stages;
        a voltage limitation control signal derived from the bias current; and
    a voltage limitation circuit, configured and arranged for receiving the voltage limitation control signal and coupled between the power terminal and an input port of the amplification stage, the input port configured and arranged to provide a voltage-limited voltage to at least said first one of the amplification stages, to provide the rf output signal to the next amplification stage.

2. A circuit according to claim 1, wherein said control circuit includes a voltage-to-current converter having a predetermined current control characteristic.

3. A circuit according to claim 2, wherein said control circuit includes a current mirror circuit for copying an output current of said voltage-to-current converter to generate said bias current and a second current, wherein said second current is supplied to a voltage buffer circuit for generating said voltage limitation control signal.

4. A circuit according to claim 3, wherein said voltage buffer circuit comprises an operational amplifier connected to a resistor through which said second current is caused to flow.

5. A bias control circuit according to claim 1, wherein said voltage limitation circuit comprises a variable resistor connected between the power terminal and said at least one amplification stage.

6. A circuit according to claim 5, wherein said variable resistor comprises a transistor which is arranged to receive said voltage limitation control signal at a control terminal thereof.

7. A circuit according to claim 1, further including at least two of said control circuits and voltage limitation circuits allocated to a respective stage of said amplifier circuit.

8. An amplifier circuit comprising:
a power terminal that provides a supply voltage;
a plurality of amplification stages each drawing operating power from the power terminal, and each biased by separately-driven current-bias signals;
a control circuit configured to generate
a bias control signal that provides a bias current used to provide one of the current bias signals and to set a bias point at which to operate a first one of the amplification stages, and
a voltage limitation control signal derived from the bias current; and
a voltage limitation circuit coupled between the power terminal and an input port of the amplification stage, the input port configured and arranged to provide a voltage-limited voltage to each of the amplification stages.

9. The amplifier circuit of claim 8, wherein said control circuit includes a voltage-to-current converter having a predetermined current control characteristic.

10. The amplifier circuit of claim 9, wherein said control circuit includes a current mirror circuit for copying an output current of said voltage-to-current converter to generate said bias current and a second current, wherein said second current is supplied to a voltage buffer circuit for generating said voltage limitation control signal.

11. The amplifier circuit of claim 10, wherein said voltage buffer circuit comprises an operational amplifier connected to a resistor through which said second current is caused to flow.

12. The amplifier circuit of claim 8, wherein said voltage limitation circuit comprises a variable resistor connected between the power terminal and said at least one amplification stage.

13. The amplifier circuit of claim 12, wherein said variable resistor comprises a transistor which is arranged to receive said voltage limitation control signal at a control terminal thereof.

14. The amplifier circuit of claim 8, wherein said control circuit includes a voltage-to-current converter having a predetermined current control characteristic, and wherein said voltage limitation circuit comprises a variable resistor connected between the power terminal and said at least one amplification stage.

15. In a circuit arrangement having multiple amplification stages, each drawing operating power from a power terminal that provides a supply voltage, a circuit comprising:
a control circuit including a voltage-to-current converter having a predetermined current control characteristic and being configured to generate a bias current and a second current, wherein the bias control signal provides a bias current used to set a bias point at which to operate a first one of the amplification stages and the second current is supplied to a voltage buffer circuit for generating said voltage limitation control signal;
a voltage limitation control signal at least predominantly based on the bias current; and
a voltage limitation circuit, configured and arranged for receiving the voltage limitation control signal and coupled between the power terminal and an input port of the amplification stage, the input port configured and arranged to provide a voltage-limited supply voltage to at least one of the amplification stages.

* * * * *